Oct. 13, 1970 J. R. BIARD 3,534,231

LOW BULK LEAKAGE CURRENT AVALANCHE PHOTODIODE

Filed Feb. 15, 1968

JAMES R. BIARD
INVENTOR

[signature]
ATTORNEY

United States Patent Office 3,534,231

Patented Oct. 13, 1970

3,534,231
LOW BULK LEAKAGE CURRENT AVALANCHE PHOTODIODE

James R. Biard, Richardson, Tex., assignor to Texas Instruments Incorporated, Dallas, Tex., a corporation of Delaware Filed Feb. 15, 1968, Ser. No. 705,660
Int. Cl. H01j *39/12;* H01l *11/00, 15/00*
U.S. Cl. 317—235 12 Claims

ABSTRACT OF THE DISCLOSURE

Disclosed is an avalanche photodiode having a highly doped semiconductor back region within a diffusion length of the front photodiode junction to reduce the bulk leakage current.

This invention relates to semiconductor photodetectors, and more particularly to an avalanche photodiode with reduced bulk leakage.

There are requirements today for photodetector devices that will detect light having a wavelength within the range of about 0.3–4.0 micrometers, $\mu$m. Photodetectors for this range of wavelength of light can be made from such semiconductor materials as germanium, 0.6 to 1.6 $\mu$m.; silicon, 0.3 to 1.1 $\mu$m.; and indium arsenide, InAs, 1.0 to 4.0 $\mu$m. For example, germanium is a commonly used substrate material for a photodiode that will detect light having a wavelength of 0.6 to 1.6 $\mu$m., as mentioned above. However, the relatively high bulk leakage current of a photodiode made from germanium restricts its use unless cooling apparatus is used conjunctively. The bulk leakage current in a photodiode contributes to noise by a modification of the Shot Noise Equation, the Avalanche Noise Equation:

$$i_n^2 = 2q\Delta f I_{co} M^d \quad (1)$$

where:
$i_n$=avalanche noise current
$q$=electron charge
$\Delta f$=noise bandwidth
$I_{co}$=bulk leakage current
M=avalanche gain
$d$=noise power slope Germanium, because of its small energy-bandgap, has a high thermally generated bulk leakage, and by noise analysis studies at room temperature it is known that the minimum noise equivalent power, NEP, is limited by the bulk leakage current of a germanium avalanche photodiode. Reduction of the bulk leakage, $I_{co}$, results in an improved NEP which can be accomplished by cooling the photodiode, a commonly used technique. However, cooling the diode requires refrigeration or thermoelectric devices with high power requirements.

Therefore, an object of the invention is an avalanche photodiode having reduced bulk leakage without having to be cooled.

Another object of the invention is an avalanche photodiode having reduced bulk leakage due to its internal construction.

The novel features believed to be characteristic of this invention are set forth with particularity in the appended claims. The invention itself, however, as well as further objects and advantages thereof may best be understood by reference to the following detailed description when read in conjunction with the accompanying drawing, wherein:

Briefly, the invention utilizes an additional semiconductor region (which can be a region, layer or substrate depending upon the fabrication method) doped to a level higher than that of the lighter doped side of the photodiode junction with which it is in contact, the preferred embodiment of the invention having an $N^+P$ photodetecting or front junction and a $PN^+$ back junction which may be reverse biased to reduce the bulk leakage of the diode.

In an $N^+P$ junction, the bulk leakage current is primarily due to the minority carrier current on the lighter doped side of the junction, said lighter doped side being the P-type side in the embodiments shown. The bulk leakage current is proportional to the slope of the minority carrier concentration at the edge of the depletion region. The concentration is approximately zero at the depletion region edge and increases exponentially to the thermal equilibrium value, $n_p$, as determined by:

$$n_p = n_i^2/N_A \quad (2)$$

where $n_i$=intrinsic carrier concentration
Example:
Germanium=$2.5\times10^{13}$cm.$^{-3}$ at 25° C.
Silicon=$1.4\times10^{10}$cm.$^{-3}$ at 25° C.
Indium arsenide=$1\times10^{15}$cm.$^{-3}$ at 25° C.
$N_A$=donor impurity concentration.

For the case in which the P-type region is very thick, the current is:

$$I_{co} \approx I_n = qD_n n_p A/L_n \quad (3)$$

where $I_n$=minority carrier current on the P-type side
$q$=electron charge
$D_n$=electron diffusion constant
$L_n$=electron diffusion length in P type material
A=area of diode In this case, the slope of the minority carrier electrons is equal to $n_p/L_n$.

Equation 3 shows that $I_{co}$ is proportional to $n_p$, which in turn is determined by $N_d$. Since $N_d$ is normally chosen to give a required depletion layer width at breakdown, $I_{co}$ is thus predetermined. However, if the back junction is within a diffusion length of the top photo-detecting junction, $I_{co}$ can be reduced. With the back junction reverse biased, the current through the back junction is also proportional to the slope of the minority carrier concentration at the edge of the junction. If current flows in both junctions, $n_p$ cannot be maintained between the junctions, and the bulk leakage current will be less than predicted by Equation 3; the reduction of current can be quite substantial.

A reduction by a factor of 6 using a back junction is equivalent to a reduction in temperature of 30° C., since cooling the diode reduces the bulk leakage current by a factor of 2 for approximately every 10° C. decrease in temperature.

Figure 1:
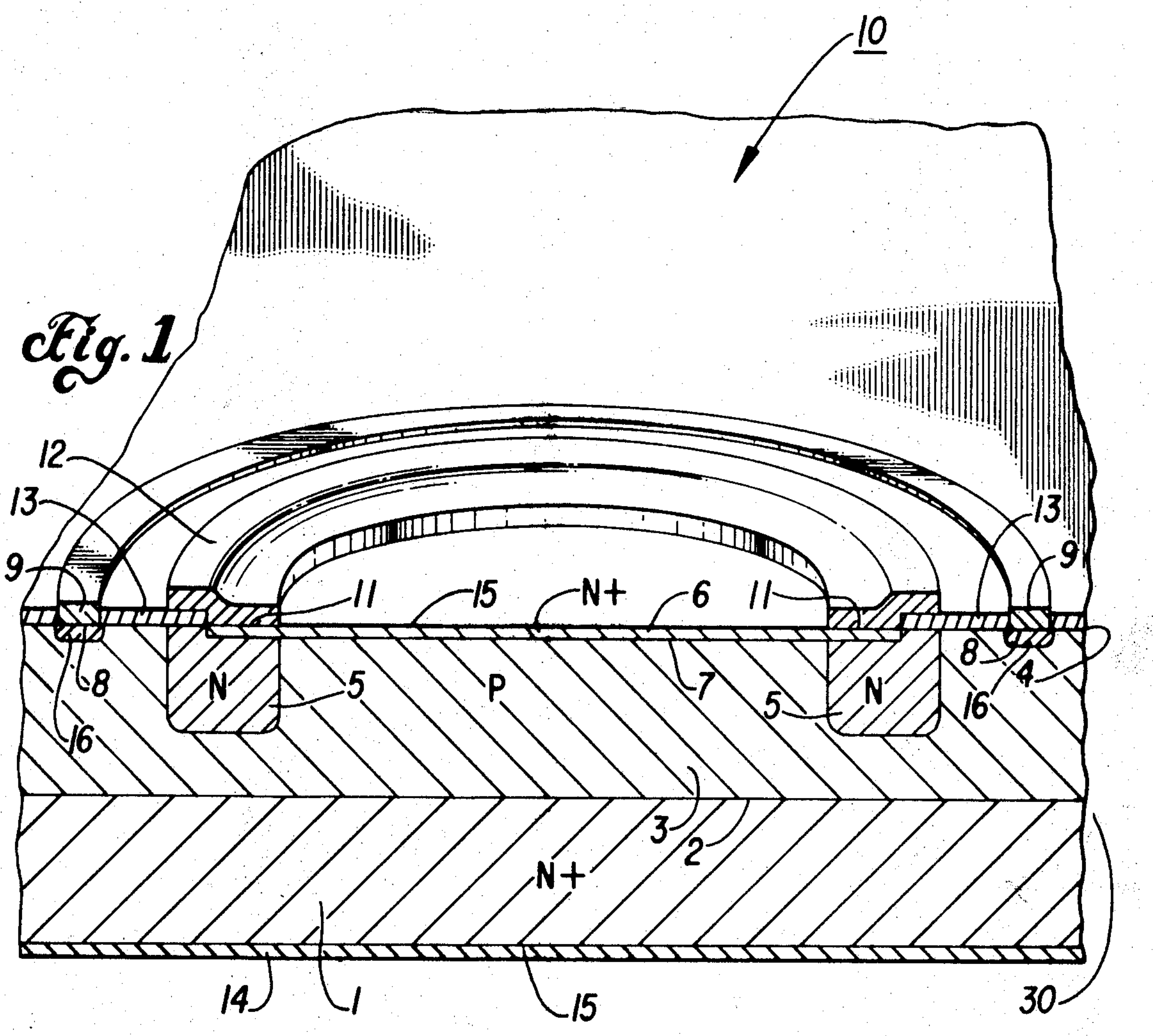
FIG. 1 is a pictorial view, partially in section, illustrating the preferred embodiment of the invention, which shows the highly doped semiconductor region of one conductivity type contiguous with the back side of the photodetector junction of opposite conductivity type, forming a back junction therebetween to reduce the bulk leakage.

Referring now to the figures, the preferred embodiment of the invention is shown in FIG. 1. Although the invention is described in conjunction with a guardring type photodiode, it should be made clear that the photodetector of the invention is not limited to any particular type construction, the only requirement being a photodetecting junction having uniform breakdown. In addition, certain doping levels and certain conductivity-type combinations are described for clarity of illustration, only, and are not meant to limit the invention in any manner whatsoever. For example, the conductivity types indicated in the figures can be reversed to form complementary structures. In fabricating a typical diode 10, as shown in FIG. 1, different sequences of process steps can be taken rather than those shown without substantially affecting the quality of the diode 10.

One method of forming the diode of the invention, for example, uses the $N^+$ type starting substrate 1 of germanium which has been doped with antimony, for example, to a resistivity of about 0.1 ohm-cm. The method described herein would be substantially the same for silicon and indium arsenide with a change only in typical doping levels to furnish the required depletion width in each material, the use of germanium being described only for convenience. The $N^+$ type substrate or region 1 can be formed by any number of conventional methods, one of the most practical being the introduction of the antimony impurity during the formation of the germanium crystal before being sliced into the substrate 1. A P-type layer 3 doped with gallium, for example, to a resistivity of about 0.7–0.9 ohm-cm. is epitaxially deposited on the surface 2 of the substrate 1 by conventional methods well known in the semiconductor art, the particular resistivity being determined by the depletion layer width desired. The desired relationship between the doping levels of a higher doped region ($N^+$, for example) as compared to a lower level N type region, for example, is that the resistivity of the N type region should be at least one order of magnitude greater than the $N^+$ type region. An alternate method of forming the semiconductor body 30 would be to form a P-type region in an $N^+$ type substrate or vice versa.

The impurity concentration of the P-type region 3 was chosen so that the depletion width at the breakdown voltage of the $N^+P$ junction 7, to be formed later, was 4 or 5 absorption lengths, $1/\alpha$ (where $\alpha$ is the absorption coefficient for the desired wavelength of light).

This criteria, in addition to making the active junction depth small as compared to the absorption length, insures that essentially all of the incident light is absorbed in the high-field absorption region, the depletion width below junction 7. In germanium the absorption length is approximately 1.0 $\mu$m. at at wavelength of 1.0 $\mu$m. By using 0.7 to 0.9 ohm-cm. P-type material, the depletion depth at breakdown is approximately 5.0 $\mu$m. and the breakdown voltage is approximately 40 volts. The internal quantum efficiency is greater than 95% and is flat from DC to approximately 4 gHz.

The surface 2 of the $N^+$ substrate 1 contiguous with the P-type layer 3 defines the $PN^+$ back junction 2, which, when reversed biased during the operation of the completed diode 10, decreases the undesired bulk leakage of the diode. The thickness of the P-type layer 3 is determined by the thickness of the depletion region plus the minority carrier diffusion length in the layer 3.

A layer of insulating material (not shown except for the portion 13), such as silicon oxide, for example, is formed on the surface 4 of the P-type layer 3 by any conventional method, such as pyrolitic deposition or thermal growth, for example, to serve as a mask for the formation of the circular guardring region 5. A layer of photoresistive material (not shown), such as KMER, manufactured by Eastman Kodak, Rochester, N.Y., is formed on the surface of the insulating layer. The photoresistive material is formed into a mask by exposing the photoresistive material to a pattern of light, followed by subjecting the material to a solvent which removes the unexposed material. The remaining photoresistive material and the uncovered portion of the insulating layer are subjected to an etching condition for a period of time sufficient to remove the uncovered portion of the insulating layer, thereby exposing the surface portion 11 of the surface 4 for a subsequent diffusion which forms the guardring region 5.

The remaining photoresistive material is removed and the germanium body 30, comprising the substate 1 and the layer 3, is placed in a conventional diffusion furnace containing an atmosphere having an N-type impurity, such as antimony, for example, for a period of time sufficient to form an N-type region 5 which, being circular, serves as a guardring for the diode 10. The guardring prevents any premature breakdown at the edge of the photodetecting junction to be formed later due to the elimination of the sharp radius of junction curvature of the simple planar junction. The avalanche breakdown at the edge would normally prevent the active center region of the junction from reaching the high electric fields necessary for avalanche gain. High electric fields can be obtained by using a guardring because of the larger radius of junction curvature resulting from its greater depth and because of the depletion region extending out on both sides of the junction.

The body 30 is removed from the furnace and a layer of photoresistive material (not shown) is formed over both the remaining insulating layer and the new insulating layer (not shown) formed over the surface portion 11 during the diffusion operation. The photoresistive material is patterned to form a mask, as previously described, which exposes the portion of the insulating layers covering the surface portion 15 of the surface 4 which extends out to and lies partially within the surface portion 11 of the surface 4. The photoresistive material and the uncovered portion of the insulating layers are subjected to an etching condition for a period of time sufficient to remove the uncovered portion of the insulating layers and expose the surface portion 15.

The photoresistive material is removed and the body 30 is placed back into a conventional diffusion furnace containing an N-type impurity atmospphere, such as antimony, for example, for a period of time sufficient to form an $N^+$ type active region 6 which is shallower and doped to a level higher than the underlying P-type region 3, shallower than the N-type region 5 and extends out to a location between the inner and outer circumferences of the N-type region 5. The $N^+$ type region 6 and the P-type layer 3 define, therebetween, the photodetecting or forward junction 7, which is the active or photodetecting junction of the diode 10.

The body 30 is removed from the furnace and a layer of photoresistive material (not shown), patterned to form a mask, as previously described, is formed on the insulating layers remaining from prior operations and the new insulating layer (not shown) formed during the last diffusion step. The mask exposes the portion of the insulating layers covering the surface portion 8 of the surface 4. The photoresistive materials and the uncovered portion of the insulating layers are subjected to an etching condition for a period of time sufficient to remove the uncovered portion of the insulating layers and expose the surface portion 8.

A layer of metal (not shown), such as aluminum, for example, is formed on the surface of the photoresistive material and the exposed surface portion 8 by any convention method, such as RF-sputtering or evaporation.

The surface of the metal layer is covered with a layer of photoresistive material (not shown) and patterned, as previously described, to expose all of the metal layer except the portion required for the P-type contact 9. The photoresistive material and the uncovered portion of the metal layer are subjected to an etching condition for a period of time sufficient to remove all of the uncovered metal, thereby leaving only the P-type contact 9. The photoresistive material is removed. The body 30 is then heated for a period of time sufficient to alloy the P-type contact 9 to the P-type layer 3, thereby forming a P+ type alloyed inversion stopper ring region 16 in addition to a low resistance ohmic connection to the P-type layer 3.

Rather than forming the inversion stopper ring region 16 by alloying a P-type metal, the stopper ring may also be formed by a diffusion process. The contact 9 would be subsequently applied in the same manner as described above.

The surface of the P-type contact 9 and the insulating layers are covered by a layer of photoresistive material (not shown) which is patterned, as previously described, to expose the portion of the insulating layers overlying the surface portion 15 of the surface 4. The uncovered portion of the insulating layers and the photoresistive material are subjected to an etching condition for a period of time sufficient to remove the uncovered portion of the insulating layers and expose the surface portion 15. The photoresistive material is removed and another layer of photoresistive material (not shown) is deposited on the surface of the P-type contact 9, the surface of the insulating layers and the surface portion 15. The layer of photoresistive material is patterned, as previously described, exposing both the inner portion of the surface portion 11 and the portion of the insulating layer overlying the outer portion of the surface portion 11. A double layer of metals (not shown), such as molybdenum-gold, for example, is deposited on the surface of the photoresistive material, the uncovered portion of the insulating layers and the exposed portion of the surface portion 11 by RF-sputtering or evaporation, for example, by first depositing a molybdenum layer followed by a gold layer. The double metal layer is then covered with another layer of photoresistive material (not shown) which is patterned, as previously described, to expose all of the metal layer except the portion that is needed for the N-type contact 12. The photoresistive material and the uncovered portion of the metal layer are subjected to an etching condition for a period of time sufficient to remove all of the metal except the N-type contact 12, which makes ohmic connection to the portion of the N+ type region 6 overlying the N-type guardring 5. The photoresistive material is then removed.

The back contact 14 of metal, such as gold, for example, is formed on the surface 15 of the substrate 1 by evaporation, for example, which makes an ohmic connection to the N+ type back region or substrate 1. The diode 10 can be mounted on any suitable mounting surface and electrical connection made to the P-type contact 9, the N-type contact 12 and the back contact 14.

Rather than depositing the P-type layer 3 on the N+ type substrate 1, an N+ type region could be formed by diffusion from the back of a P-type substrate, thus evidencing that the particular procedural steps of fabricating the diode 10 play no part in the invention.

Figure 2:
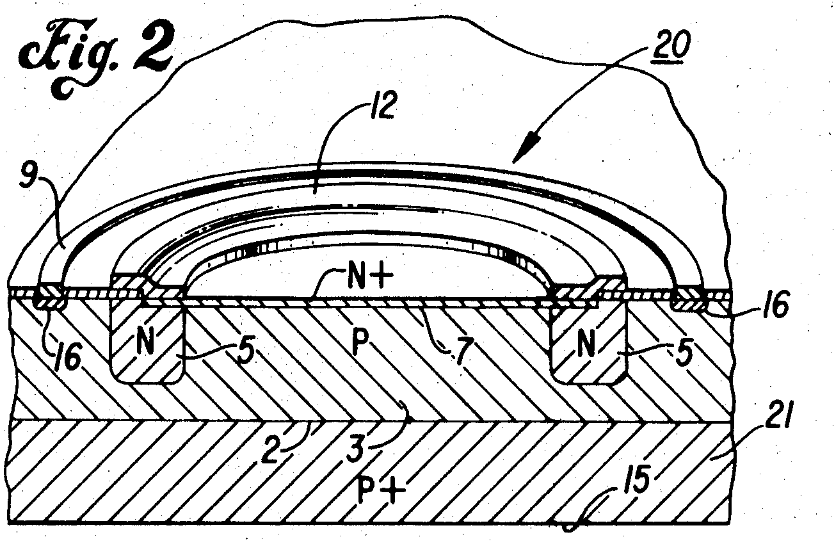
FIG. 2 is a pictorial view, partially in section, illustrating another embodiment of the invention, which shows the highly doped semiconductor region of one conductivity type contiguous with the back side of the photodetector junction of the same conductivity type to reduce the bulk leakage.

In FIG. 2 is shown another embodiment of the invention which is similar to the diode 10, as shown in FIG. 1, the same numerical designations being used in both figures to describe similar features. The difference between diode 10 and diode 20 is that diode 20 has a P+ type region 21 rather than the N+ type region 1, as shown in FIG. 1, which is formed by a diffusion into the back of a P-type substrate. The P-type region 3 can also be formed, alternately, by epitaxially depositing P-type material on the P+ type substrate 21. Since there is no requirement for an electrical connection to the P+ type back region 21, no back contact is required.

Equation 2 shows that $n_p$ in the P+ type layer 21 is much smaller than that in the P-type region 3 near the junction 7. By having this P+ type region 21 within a diffusion length of the photodioded junction 7, the effect is similar to that of the back junction structure as shown in FIG. 1. The value for $n_p$ cannot be maintained in the P-type region 3 near the junction; therefore the slope of the minority carrier density and the bulk leakage current is smaller. Although the effect is less than that in the back junction structure as shown in FIG. 1, the bulk leakage reduction structure as shown in FIG. 2, is passive and does not require an additional bias supply.

Various modifications of the invention will become apparent to persons skilled in the art without departing from the spirit and scope of the invention.

What is claimed is:

1. An avalanche photodetector comprising:

(a) a semiconductor body having first and second major surfaces on opposite sides thereof;

(b) a first region of one conductivity type in said semiconductor body extending to said first surface thereof;

(c) a second shallower and more highly doped region of opposite conductivity type in said first region extending to said first surface, said first region and said second region defining a photodetecting junction therebetween;

(d) means for exposing said photodetecting junction to light;

(e) a less than degenerate back region, more highly doped than said first region in the semiconductor body, extending to said second surface thereof, said back region being in contact with at least a portion of said first region and located within a diffusion length of said photodetecting junction, thereby decreasing the bulk leakage of the photodetector; and (f) a contact on said first surface ohmically connected to said first region and another contact on said first surface ohmically connected to said second shallower region.

2. The photodetector defined in claim 1, including a contact on said second surface of the semiconductor body ohmically connected to said back region, wherein said back region is of said opposite conductivity type, thereby defining a back junction between the first region and said back region.

3. The photodetector defined in claim 1, wherein said back region is of said one conductivity type.

4. The photodetector defined in claim 1, including a guardring region of said opposite conductivity type, having a circular shape with an outer and an inner circumference, in said first region, being deeper than said second region and extending to said first surface, said second region being centrally located within and extending out to a location between said inner and outer circumferences of the guardring region.

5. The photodetector defined in claim 4, including a contact on said second surface of the semiconductor body ohmically connected to said back region, wherein said back region is of said opposite conductivity type, thereby defining a back junction between the first region and said back region.

6. The photodetector defined in claim 5 wherein said semiconductor body is comprised of germanium.

7. The photodetector defined in claim 5 wherein said semiconductor body is comprised of silicon.

8. The photodetector defined in claim 5 wherein said semiconductor body is comprised of indium arsenide.

9. The photodetector defined in claim 4 wherein said back region is of said one conductivity type.

10. The photodetector defined in claim 9 wherein said semiconductor body is comprised of germanium.

11. The photodetector defined in claim 9 wherein said semiconductor body is comprised of silicon.

12. The photodetector defined in claim 9 wherein said semiconductor body is comprised of indium arsenide.

References Cited

UNITED STATES PATENTS

| | | | |
|---|---|---|---|
| 3,275,910 | 9/1966 | Phillips | 317—235 |
| 3,293,010 | 12/1966 | Hackley | 317—235 X |
| 3,319,138 | 5/1967 | Bergman et al. | 317—235 |
| 3,323,955 | 6/1967 | Jochems et al. | 317—235 X |
| 3,359,137 | 12/1967 | Kaye et al. | 317—235 X |
| 3,378,915 | 4/1968 | Zenner | 317—235 X |
| 3,410,735 | 11/1968 | Hackley | 317—235 X |

WALTER STOLWEIN, Primary Examiner

T. N. GRIGSBY, Assistant Examiner

U.S. Cl. X.R.

250—211